United States Patent
Hovakimyan et al.

(10) Patent No.: US 10,735,013 B2
(45) Date of Patent: Aug. 4, 2020

(54) LINEAR AND NON-LINEAR CALIBRATION FOR TIME INTERLEAVED DIGITAL-TO-ANALOG CONVERTER

(71) Applicant: Tektronix, Inc., Beaverton, OR (US)

(72) Inventors: Karen Hovakimyan, San Jose, CA (US); Gregory A. Martin, Lake Oswego, OR (US); Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/526,875

(22) Filed: Jul. 30, 2019

(65) Prior Publication Data

US 2020/0212922 A1  Jul. 2, 2020

Related U.S. Application Data

(60) Provisional application No. 62/787,223, filed on Dec. 31, 2018.

(51) Int. Cl.
*H03M 1/10* (2006.01)
*H03M 1/84* (2006.01)

(52) U.S. Cl.
CPC .......... *H03M 1/1033* (2013.01); *H03M 1/84* (2013.01)

(58) Field of Classification Search
CPC ..... H03M 1/1033; H03M 1/84; H03M 1/1052
USPC ................. 341/120, 118, 144, 155, 146, 140
See application file for complete search history.

(56) References Cited

U.S. PATENT DOCUMENTS

| | | | |
|---|---|---|---|
| 8,410,843 B2 | 4/2013 | Goodman et al. | |
| 9,007,250 B1 | 4/2015 | Jeraj et al. | |
| 9,685,969 B1 * | 6/2017 | Garg | H03M 1/10 |
| 10,340,933 B1 * | 7/2019 | Hovakimyan | H03M 1/662 |
| 10,355,706 B1 * | 7/2019 | Stein | H03M 1/1085 |
| 10,461,764 B1 * | 10/2019 | Paro Filho | H03M 1/1033 |

(Continued)

OTHER PUBLICATIONS

Clayton Daigle et al, a 12-bit 800-MS/s Switched-Capacitor DAC with Open-Loop Output Driver and Digital Predistortion, 2010 IEEE Asian Solid-State Circuits Conference, Nov. 8, 2010, pp. 1-4, IEEE, Beijing, China.

(Continued)

*Primary Examiner* — Peguy Jean Pierre
(74) *Attorney, Agent, or Firm* — Miller Nash Graham & Dunn; Andrew J. Harrington

(57) ABSTRACT

A time-interleaved digital-to-analog converter system, comprising a digital pre-distorter configured to receive an input digital signal and an error signal and output a distorted digital signal based on the input digital signal and the error signal; a time-interleaved digital-to-analog converter having a first sample rate, the time-interleaved digital-to-analog converter configured to convert the distorted digital signal to an analog signal; and a calibration system. The calibration system includes an analog-to-digital converter having a second sample rate equal to or lower than the first sample rate, the analog-to-digital converter configured to receive the analog signal and covert the analog signal to a down-sampled digital signal, a discrete-time linear model configured to receive the input digital signal and the error signal and output a model signal, and a combiner to subtract the down-sampled digital signal from the model signal to generate the error signal.

20 Claims, 12 Drawing Sheets

(56) References Cited

U.S. PATENT DOCUMENTS

| | | | |
|---|---|---|---|
| 2012/0176190 A1* | 7/2012 | Goodman | H03M 1/0626 327/551 |
| 2014/0161207 A1 | 6/2014 | Teterwak | |
| 2015/0061911 A1 | 3/2015 | Pagnanelli | |

OTHER PUBLICATIONS

European Patent Office, Extended European Search Report and Written Opinion for European Patent Application 19220201.8, May 29, 2020, 9 pages, Munich, Germany.

* cited by examiner

US 10,735,013 B2

LINEAR AND NON-LINEAR CALIBRATION FOR TIME INTERLEAVED DIGITAL-TO-ANALOG CONVERTER

CROSS-REFERENCE TO RELATED APPLICATIONS

This application claims the benefit of provisional U.S. Pat. App. Ser. No. 62/787,223, filed Dec. 31, 2018, the entire contents of which are hereby incorporated by reference into this application.

FIELD OF THE INVENTION

This disclosure is directed to systems and methods related to time interleaved (TI) digital-to-analog converters (DACs), and in particular, to calibrating a pre-processing digital signal processing (DSP) filter for a TI DAC.

BACKGROUND

DACs are used to convert a digital signal to an analog signal. The bandwidth of a DAC, however, can be limited by either the analog bandwidth or the sample rate of the DAC. To achieve an effective higher DAC sample rate, a TI DAC system may be used in place of a single DAC, the TI DAC system including a number of time interleave DAC channels. Each DAC channel receives the input signal and outputs an analog signal that is offset in time within a single DAC sampling period. These analog signals can then be added or multiplexed together to effectively multiply the sampling rate of the overall DAC system.

However, in a TI DAC system, there can be linear and non-linear distortions and/or mismatches between the various channels of the TI DAC system, resulting in an analog output signal that may not be accurate.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Embodiments of the disclosure include a background and/or foreground calibration for correction of linear and non-linear distortions of a time interleaved (TI) digital-to-analog converter (DAC). As will be discussed in more detail below, correction is performed through digital pre-distortion (DPD) of TI DAC input data using a background or foreground calibration. That is, calibration may be performed in the foreground with a known signal or performed in the background during normal operation of the TI DAC. A TI DAC output is captured by an analog-to-digital converter (ADC) and compared to the properly processed DAC input to form an error signal, which is used for least mean squares (LMS) adaptation of DPD coefficients.

Figure 1:
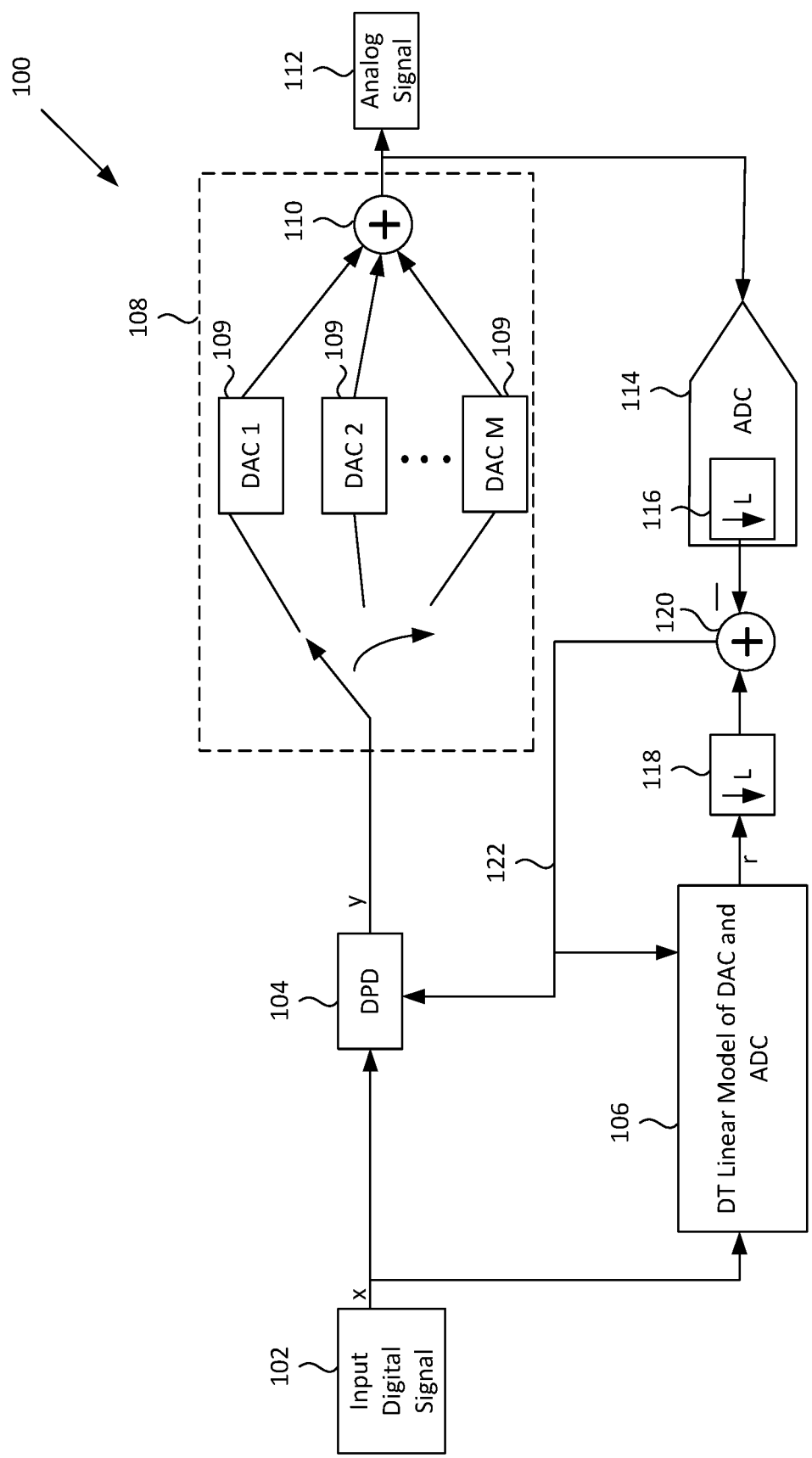
FIG. 1 is a block diagram of a time-interleaved digital-to-analog converter system according to some embodiments of the disclosure.

FIG. 1 illustrates an example TI DAC system 100 according to some embodiments of the disclosure. Digital input signal 102, shown as x, is received at an input and transmitted to a DPD unit 104 and a discrete time (DT) linear model of DAC and ADC unit 106, referred to herein as a DT linear model unit 106. The digital input signal processed through the DPD unit 104 is transmitted to M parallel TI DAC channels 109 of a TI DAC 108, with indexes m =1, . . . , M, where M is an integer greater than one. The output of each of the DAC channels 109 are summed together through a summer 110, or sequentially selected by a multiplexer in place of summer 110, and output as an analog signal 112. If the TI DAC system 100 is used as a part of a test and measurement instrument, the analog signal 112 may be output to a device under test through a port of the test and measurement instrument. The analog signal 112 is also sent to an ADC 114, which is used for calibrating the DPD unit 104.

The ADC 114 sampling rate is L times lower compared to the TI DAC 108 rate, which is shown in FIG. 1 as a downsampler 116. The ADC 114 bandwidth is matched to TI DAC 108 bandwidth, so as to capture the full output spectrum. A pre-sampler component could be used prior to a lower bandwidth ADC to achieve the same result. The down sampling rate L is chosen to be relatively prime to M so that all the TI sample phases may be covered in the error waveform and resulting adaptation. That is, L and M have no common factors other than one.

The output of the DT Linear Model 106 is also down-sampled by L through a downsampler 118. Then, the output of the ADC 114 is subtracted from the output of downsampler 118 through a combiner 120 to generate an error signal 122. The error signal 122 is sent to both the DT Model 106 and the DPD 104, as will be discussed in further detail below.

Figure 2:
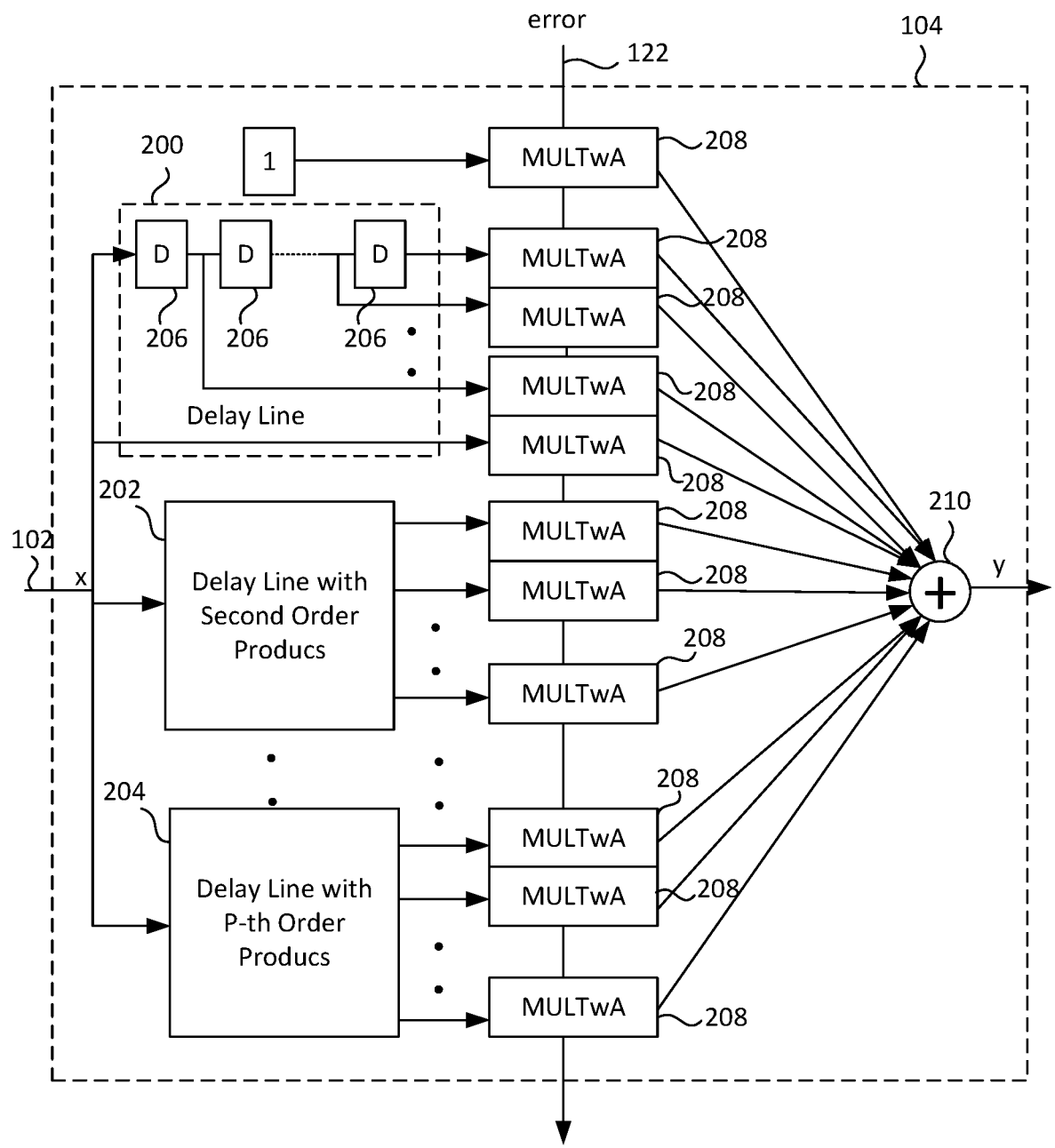
FIG. 2 is a block diagram of an example digital pre-distortion unit of FIG. 1.

Now that the overall system has been discussed, FIGS. 2-11 will illustrate the individual components of the system 100. FIG. 2 illustrates an example DPD 104, according to some embodiments of the disclosure. The DPD 104 receives the digital signal 102 and sends the digital signal to a number of delay lines. P delay lines are provided, where P is greater than one. For example, in FIG. 2, a first order delay line 200, a second order delay line 202, and a P-th order delay line 204 are illustrated.

Each delay line 200, 202, and 204 has different order products to create different order non-linearities with memory. The delay lines 200, 202, and 204 are used in conjunction with multiplication with adaptation blocks 208, to compensate corresponding order non-linearities and time interleave linear and non-linear mismatches between TI DAC channels 109. The first-order delay line 200 is illustrated in FIG. 2. Delay blocks 206 each indicate a delay by one clock cycle of the TI DAC 108 input data. The delay line with second order products block 202 and the delay line with P-th order products block 204 each consists of delay lines and the products of exactly two or P terms, respectively, of delay line components, each component being derived through operations of summation or multiplication by constant. The output of each delay line 200, 202, and 204 is sent to a multiplication with adaptation block 208. The error signal 122 is also applied to each multiplication with adaptation block 208. The output of each multiplication with adaptation block 208 is summed together through a combiner 210 and output as a signal y which is sent to the TI DAC 108.

Figure 3:
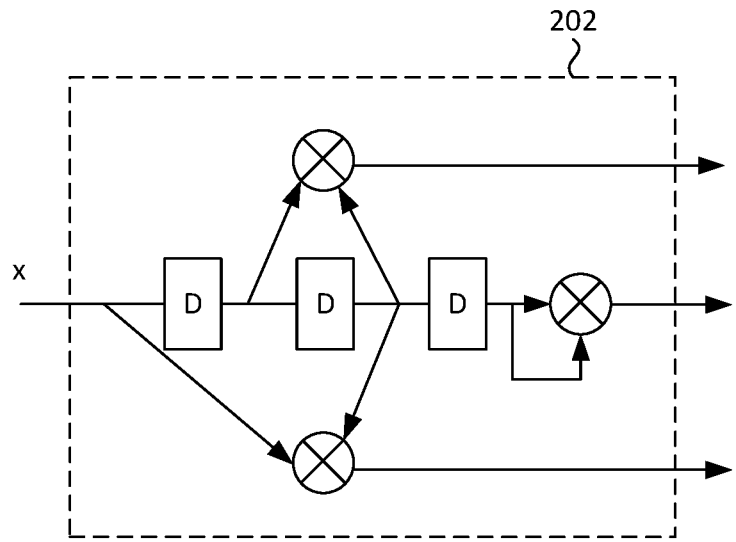
FIG. 3 is a block diagram of an example delay line with second order products of FIG. 2.
Figure 4:
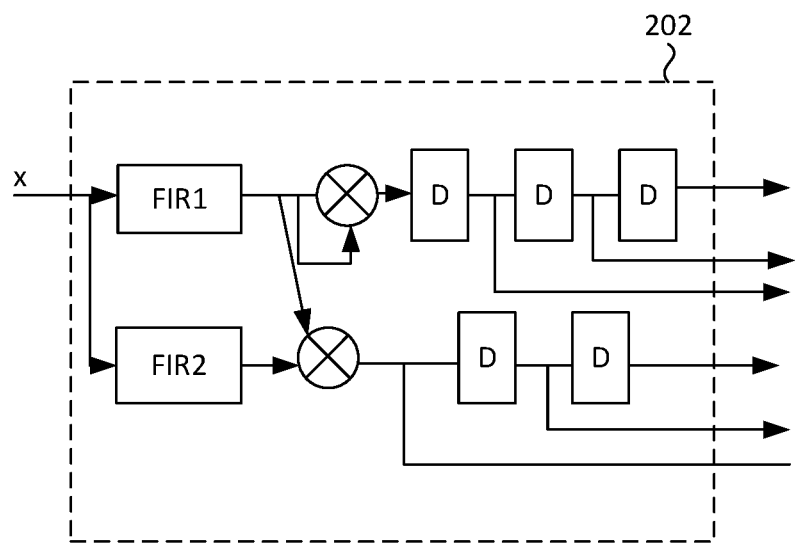
FIG. 4 is a block diagram of another example delay line with second order products of FIG. 2.

FIGS. 3 and 4 illustrate possible examples of second order delay lines 204, which may also be modified for P-th order delay lines 206. If all possible outputs of delay lines are used to form all possible p-th order products, then a p-th-order Volterra model is derived. However, a full Volterra model may be too complicated for some realizations, so a simpler version, as illustrated in FIGS. 3 and 4, may be used. The suitable simplified non-linear models with memory can be derived through analysis of the specific TI DAC 108 model and/or its simulation. These models need not be precise as they will be augmented with adaptive coefficients to compensate actual non-linearities of the TI DAC 108.

Figure 5:
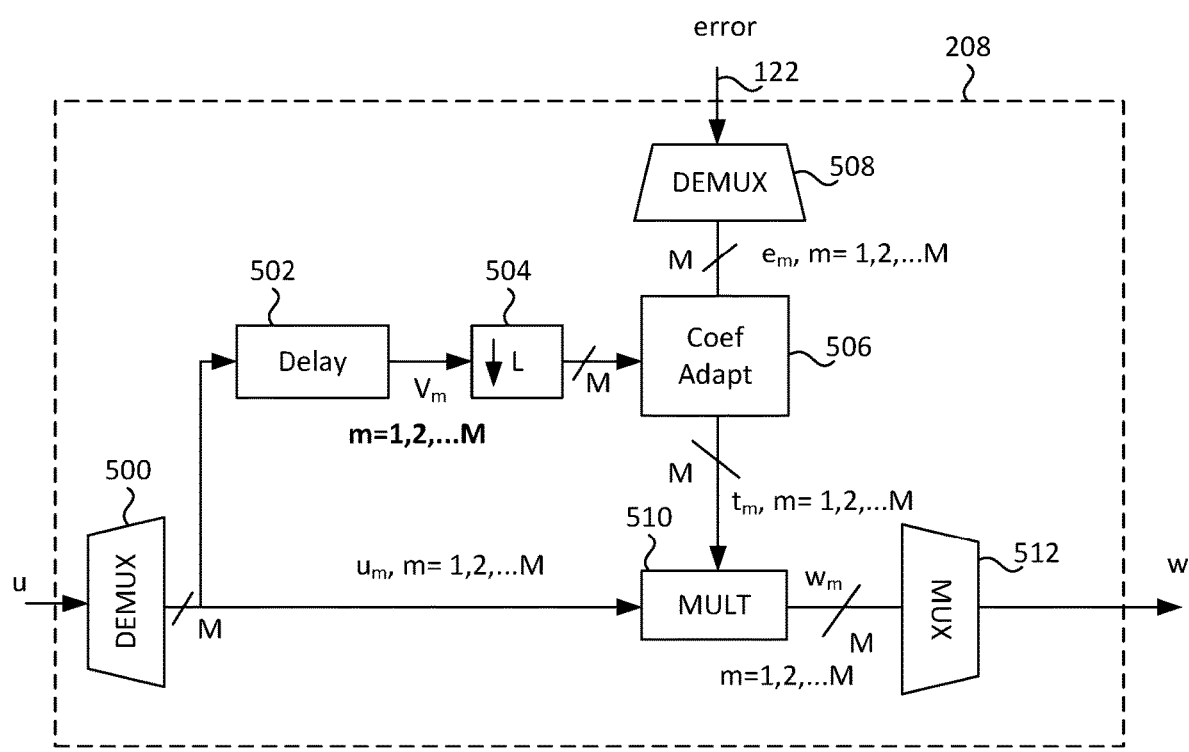
FIG. 5 is a block diagram of an example multiplication with adaptation block of FIG. 2.

FIG. 5 is a block diagram of an example multiplication with adaptation block 208. A demultiplexer 500 receives a signal u from one of delay lines 200, 202, and 204 and converts the M consecutive scalar data u, entering the block 208 at a rate equal to the TI DAC 108 rate, into a vector, $u_m$, where m is integer values 1 through M. The data vector $u_m$ is delayed by a delay block 502 to match the delay introduced by the chain of TI DAC 108 and ADC 114 at the combiner 120. The delayed data vector $v_m$ is also downsampled by downsampler 504 by L to match the undersampled ADC 114. The output of the downsampler 504 is sent to a coefficient adaptation block 506. The error signal 122 is also received at a demultiplexer 508, which converts the error signal into a vector, $e_m$, where m is integer values 1 through M, which is received at the coefficient adaptation block 506 as well. The coefficient adaptation block 506 performs LMS adaptation for a single TI DAC channel 109 to output a vector $t_m$. The vector $t_m$ is multiplied with the vector $u_m$ in the multiplier 510 to determine a combined vector $w_m$. Multiplexer 512 converts the combined vector $w_m$ into scalar data w, which is output to the combiner 210.

Figure 6:
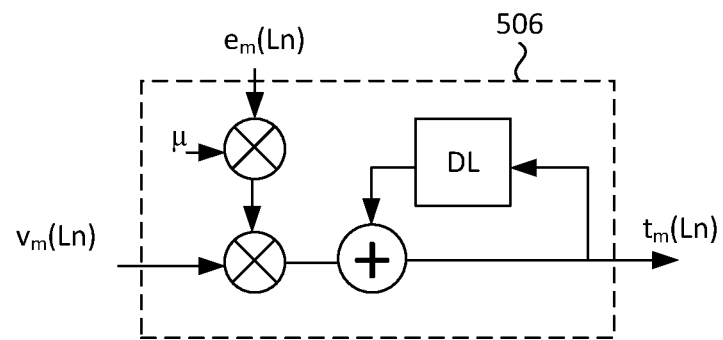
FIG. 6 is a block diagram of an example coefficient adaptation block of FIG. 5.

As mentioned above, the coefficient adaptation block 506 performs LMS adaptation, which is illustrated in FIG. 6 for one of the TI DAC channels 109. The LMS operation can also be described by the following equation (1):

$$t_m(Ln) = t_m(Ln-L) + \mu v_m(Ln) e_m(Ln) \qquad (1)$$

Where $t_m(Ln)$ is the updated coefficient value at Ln-th clock cycle relative to a sample period of a single TI DAC channel 109, while $t_m(Ln-L)$ is its preceding value decimated by L clock cycles. The variables $v_m(Ln)$ and $e_m(Ln)$ are the m-th components of the data and error, respectively, correspondingly at the nL-th clock cycle. Constant p is the adaptation constant of the LMS algorithm. Although a standard LMS operation is shown in FIG. 6, other types of LMS algorithms may also be used, such as a normalized-LMS, LMS with time-varying adaptation step, leaky LMS, or others.

Figure 7:
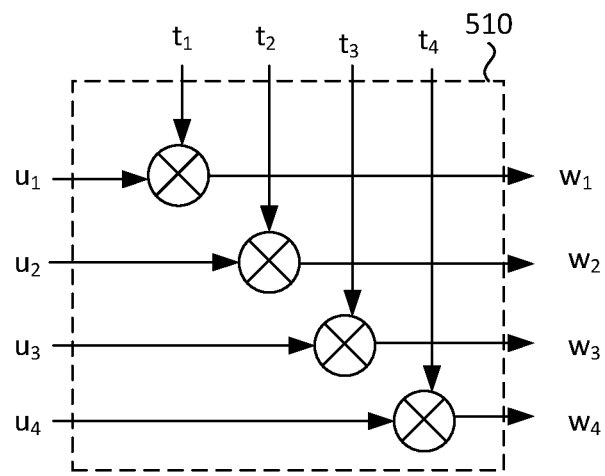
FIG. 7 is a block diagram of an example multiplication block of FIG. 5.

FIG. 7 illustrates the multiplication of the vectors $t_m$ and input data vector $u_m$ in the multiplier 510. In some embodiments as illustrated in FIG. 7, the multiplier 510 applies the coefficients $t_m$ from the coefficient adaptation block 506 to the input data vector $u_m$ by point-wise multiplication. In the example of FIG. 7, M is equal to four. This point-wise multiplication can also be described by the following equation (2):

$$w_m(n) = t_m u_m(n), \ m=1,2,\ldots,M \qquad (2)$$

Figure 8:
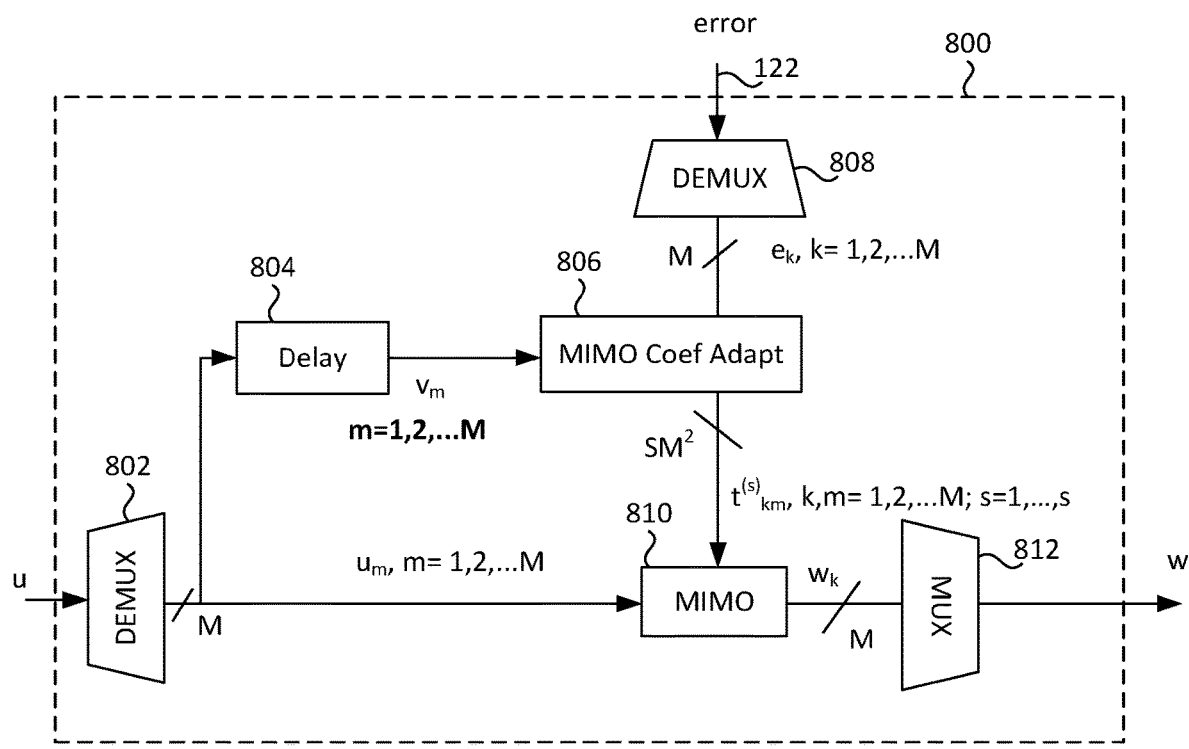
FIG. 8 is a block diagram of an alternative multiplication with adaptation block of FIG. 2.
Figure 9:
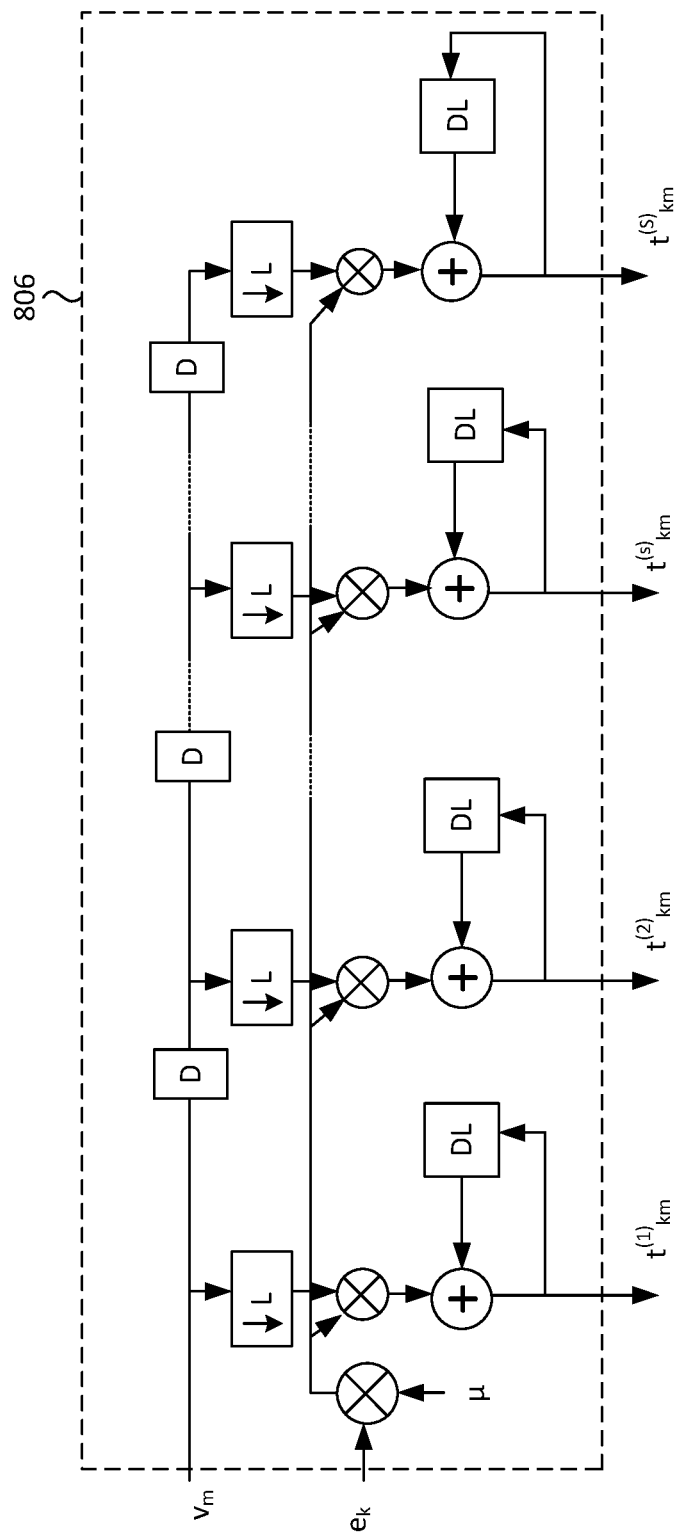
FIG. 9 is a block diagram of an example multiple input, multiple output coefficient adaptation block of FIG. 8.

FIG. 8 is a block diagram illustrating an alternative multiplication with adaptation block 800, which may be implemented in some embodiments. This circuit may be used in place of the multiplication with adaptation block 208 in FIG. 2. Similar to the multiplication with adaptation block 208, a demultiplexer 802 receives a signal u from one of delay lines 200, 202, and 204 and converts the M consecutive scalar data u, entering the block 800 at a rate equal to the TI DAC 108 rate, into a vector, urn, where m is integer values 1 through M. The data vector $u_m$ is delayed by a delay block 804 to match the delay introduced by the chain of DAC and ADC at the combiner 120. The delayed data vector $v_m$ is sent to a multiple input multiple output (MIMO) coefficient adaptation block 806, an example of which is show in FIG. 9. The MIMO coefficient adaptation block 806 also receives an error vector $e_k$, which is output by a demuliplexer 808 based on the received error signal 122, where k is integer values 1 through M. Each coefficient of the MIMO coefficient adaptation block 806 may be determined by performing the standard LMS algorithm, which can be described by equation (3):

$$t^{(s)}_{km}(Ln) = t^{(s)}_{km}(Ln-L) + \nu v_m(Ln-s+1) e_k(Ln), \ k, \\ m=1,\ldots,M; \ s=1,\ldots,S \qquad (3)$$

Similar to the coefficient adaptation block 208, other LMS algorithms may also be used.

Figure 10:
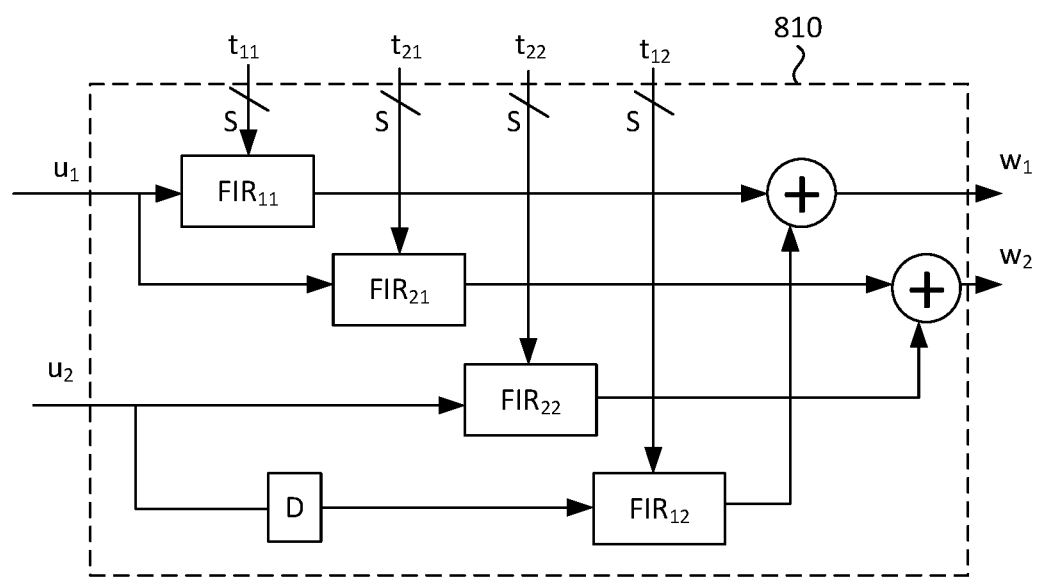
FIG. 10 is a block diagram of an example multiple input, multiple output block of FIG. 8.

The output of the MIMO coefficient adaptation block 806, $t^{(s)}_{km}$, is sent to a MIMO block 810, which is illustrated in FIG. 10 for a situation when M is equal to two. The MIMO block 810 has M inputs and M outputs and consists of $M^2$ Finite Impulse Response (FIR) filters. The input/output relation of the MIMO block 810 is given by equation (4):

$$w_k(n) = \Sigma^M_{m=1} t_{km} \otimes u_m(n), \ k=1,2,\ldots,M \qquad (4)$$

Where operator $\otimes$ stands for convolution, $u_m(n)$ is the m-th input data, and $t_{km}$ is the vector of S coefficients of the FIR with input urn and the output connected to the k-th output of the MIMO block 810 structure. Similar to multiplexer 512, multiplexer 812 converts the combined vector $w_k$ into scalar data w, which is output to the combiner 210.

Since the MIMO block 810 includes memory through delay lines of M FIR filters, some of the lines connecting the delay lines 200, 202, and 204 to the multiplication with adaptation block 208 become redundant, when the multiplication with adaptation block 208 is replaced with the alternative multiplication with adaptation block 800.

Figure 11:
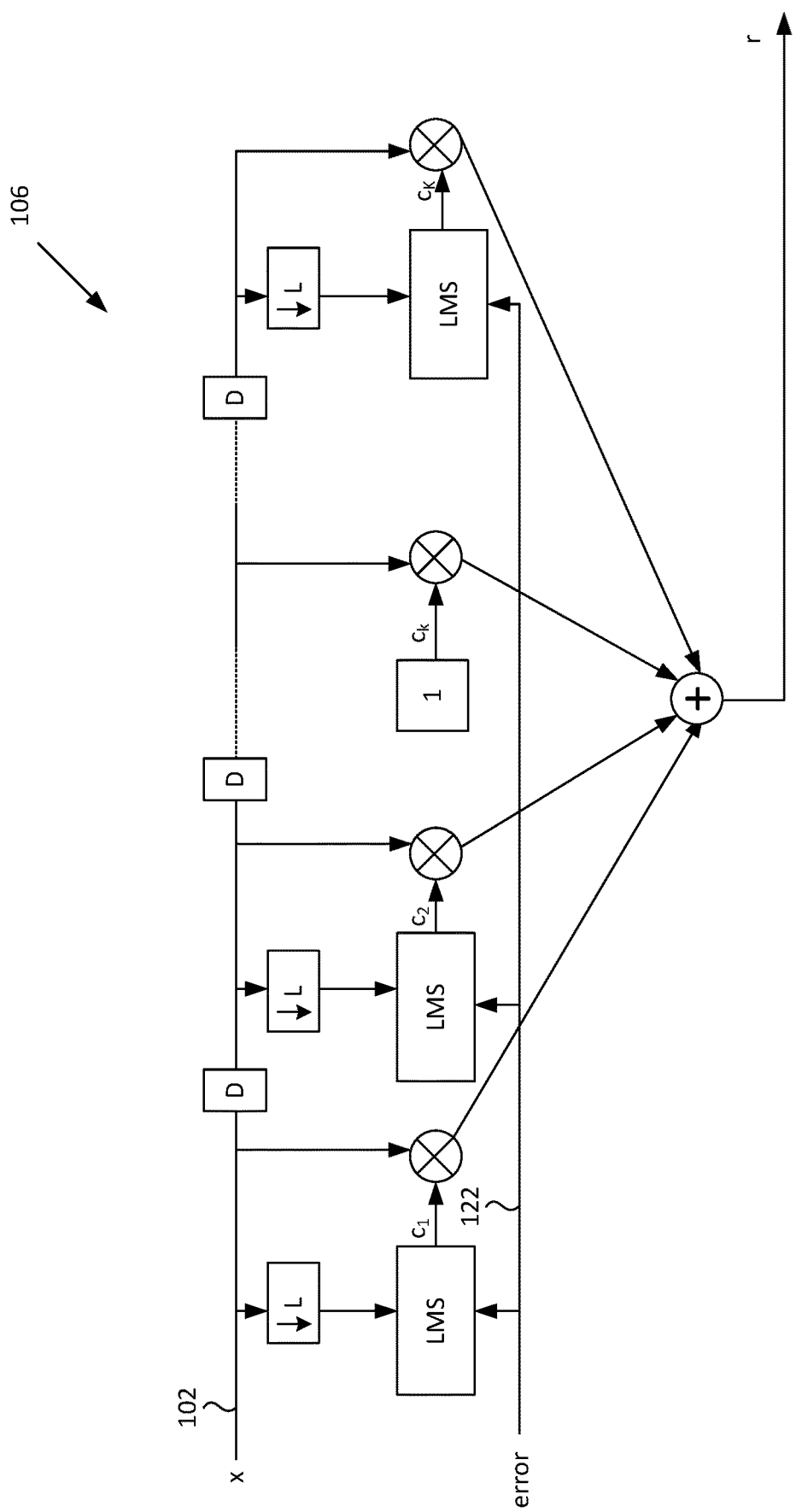
FIG. 11 is a block diagram of an example discrete time linear model of DAC and ADC of FIG. 1.

As mentioned above, the TI DAC system 100 can compensate for TI DAC linear and non-linear mismatches such that a TI DAC system 100 output will look like a linear time invariant (LTI) system. For such to be the case, the actual TI DAC output can be compared to the output of a desired LTI system, which models an operation of an ideal TI DAC. In the TI DAC system 100, the DT linear model unit 106 can perform this comparison. The structure of the DT linear model unit 106 is illustrated in FIG. 11. The DT linear model unit 106 covers linear aspects of both the TI DAC 108 and the ADC 114 that are not intended to be corrected for in the DPD unit 104.

As can be seen in FIG. 11, the DT linear model unit 106 includes a FIR filter with LMS adaptation of its coefficients. Adaptation of the DT linear model unit 106 can track changes in the linear part of the TI DAC channels 108 and the ADC 114. However, at least one tap of the FIR filter is made non-adaptive and frozen at a constant value to avoid a scenario when all the DPD unit 104 coefficients converge to zero values. While a conventional direct form FIR filter implementation is shown for the DT linear model unit 106 in FIG. 11, any other known structure may be used, such as transposed, cascade, fast FIR, lattice FIR, frequency domain, etc. Similarly, as discussed above, the LMS operation can be implemented in a multitude of ways.

In some embodiments, the calibration described above may be performed in the background as the TI DAC system 100 is producing a desired output signal. However, there may be some input signal types that can result in an error waveform used by multiple adaptation blocks having linear dependence between components of the error signal 122 that are attributed to different impairment types covered in the DPD unit 104 correction structure, allowing for multiple adaptation coefficient states that achieve the same LMS optimization for that particular input signal 102. Since these multiple adaptation states are not equivalent, the multiple adaptation states could produce significant errors when the input signal 102 characteristics change until TI DAC system 100 has had time to respond to the new input and converge to suitable coefficients for the new input signal. A trivial example of this is a constant non-zero input signal 102, wherein mismatch between the TI DAC channel 109 outputs could be corrected with DC offset terms, gain terms, and/or nonlinear terms for each of the DAC channels 109.

For static coefficient factors, i.e., memoryless components of the DPD unit 104, the key to good convergence in the background calibration is having sufficient diversity in the input waveform amplitude values, such as sufficient number of unique amplitude values, after factoring in down-sampling by under-sampled ADC 114 to solve for the multiple coefficients with parallel LMS adaptation functions.

For dynamic coefficient factors, i.e., frequency dependent components covered by delay lines in the DPD unit 104 structure, having sufficient diversity of input spectral content, that is, a sufficient number of unique frequency domain components in the spectrum, after factoring in down-sampling by the under-sampled ADC 114, is also important for good convergence in background calibration to solve for the multiple coefficients with parallel LMS adaptation functions, in addition to having sufficient diversity in amplitude values.

The criteria for good convergence in background calibration is mathematically related to being able to solve a system of equations for all unknown coefficient values, for various impairments modeled in the DPD unit 104, across multiple TIDAC channel 109 input and ADC 114 output samples, such that the LMS solution minimizes the residual error between the estimated aggregate waveform, as determined based on the input waveform and DPD unit 104 coefficient values, and the actual impairments in the waveform captured by the under-sampled ADC 114.

Consider the following equation (5):

$$\hat{e} = Uc \quad (5)$$

Where, $\hat{e}$ is a vector for estimated aggregate residual error waveform, after impact of a current DPD unit 104 correction coefficients is factored in, which is a sum of errors due to each impairment type at the output of the under-sampled ADC 114 each cycle. Variable U is an input waveform impairment matrix prior to scaling by parallel multiplication with adaptation units 204 with base impairment values in row dimension, which is the input to the multiplication with adaptation units 204, and successive sample values in column dimension, down-sampled to match the under-sampled ADC 114 rate. Variable c is a residual coefficient vector to scale magnitude of impairment values in the multiplication with adaptation units 204 to counteract impairments of DAC channels 108, i.e., minimize residual error, that can be added to current DPD coefficient vector.

This system of equations would be overdetermined in general and a least squared solution can be found to minimize the following expression:

$$\min_c \| -Uc - e \|,$$

where e=residual error vector for waveform measured following output of under-sampled ADC.

The least-squared solution can be given by equation (6):

$$c = -(U^T U)^{-1} U^T e \quad (6)$$

This solution can be found provided that the $U^T U$ matrix is not singular, i.e., $|U^T U| \neq 0$.

The parallel LMS adaptation that occurs each cycle for background calibration should converge to the solution of the above system of equations over successive values to minimize the residual error term. If the corresponding $U^T U$ matrix is not singular, or close to being singular, then background calibration should have good performance. Having good amplitude and spectral component diversity in the input waveform applied to the TI DAC 108 may make it easier for the corresponding $U^T U$ matrix to not be singular or close to singular.

If an input signal is applied to the TI DAC system 100 such that the corresponding $U^T U$ matrix is singular, or close to singular, the background calibration of the DPD coefficients may be halted to prevent the coefficient state from wandering away from the appropriate model of hardware errors. Also, a foreground calibration may be recommended, wherein a TI DAC system 100 input signal is chosen specifically to allow rapid and accurate convergence of the DPD coefficients.

In some embodiments, a real-time digital signal processor (DSP) may be added to analyze the waveform data in the TI DAC system 100 prior to any correction being performed by the DPD unit 104 to estimate $|U^T U|$ for a given timespan in the input waveform 102. The DSP can determine if background adaptation should be allowed for that timespan. The DSP can instruct the TI DAC system 100 to disable background calibration for timespans where the corresponding $|U^T U|$ is near zero and enabled for timespans where $|U^T U|$ is not too close to zero. That is, an arbitrary threshold can be determined for the system, and if the corresponding $|U^T U|$ is greater than the threshold, background calibration is enabled, and if the corresponding $|U^T U|$ is below the threshold, background calibration is disabled.

In alternative embodiments, for instances when the input waveform 102, x[n], is pre-determined, such as by loading a known waveform to pattern memory, then the $|U^T U|$ value versus time could be pre-computed as well to generate a flag, which may be stored with the pre-computed waveform in memory. The flag may enable background calibration for periods of the input waveform where convergence of DPD coefficients would have good performance and disable background calibration for periods that may not have good convergence of DPD coefficients.

Alternatively to the real-time calibration through LMS discussed above, in some embodiments, the background and/or foreground calibration may be performed offline by capturing and processing the packets of data at a later time.

To do so, the DT equivalent linear model of DAC and ADC is estimated. To minimize interference from the non-linear part of the channel 108, this estimation may be done using low amplitude input waveforms. The data captured at the ADC 114 output can be collected into the row vector d. An N/L by P matrix X can be formed, with N being the length of the TI DAC 108 input data pattern and P being the number of taps of a linear model, from DPD input data x with p-th column of matrix X comprising p-1 zeros concatenated with the first N−p+1 data, followed with decimation by the factor L. The linear model FIR coefficients can then be found using equation (7):

$$c = (dX)(X'X)^{-1} \quad (7)$$

Where the designation X' is used for matrix X transposed.

Once the linear model FIR coefficients c are estimated from equation (7), new TI DAC 108 data with full scale amplitude can be captured at ADC 114 and processed. Using the same designation d for data packet (row vector) captured at the ADC 114 output, the designations x, u for data packets (row vectors) at DPD unit 104 and MIMO block 810 inputs correspondingly, the MIMO coefficients t (M by T matrix) can be found as follows.

The error vector may be computed by first convolving the input data with the Linear Model filter coefficients as shown in equation (8):

$$q = \operatorname{conv}(x,c) \quad (8)$$

Second, by down-sampling by the factor L the convolution output and subtracting the data captured at ADC 114 output:

$$e = \operatorname{downs}(q,L) - d \quad (9)$$

Then, matrix B can be formed with T (S times M) columns and N/L rows (N is data packet length) with t-th column comprising t-1 zeros concatenated with first N−t+1 data in the vector u of the MIMO block 800 input, followed with decimation by the factor L. The m-th phase of the vector e decimated by M can be designated by $e_{(m)}$, as shown in equation 10:

$$e_{(m)}(k) = e(m+(k-1)M), k=1,2,\ldots,\frac{N}{M}; m=1,\ldots,M \quad (10)$$

And similarly $B_{(m)}$ can be a decimated matrix according to equation (11):

$$B_{(m)}(k,:) = B(m+(k-1)M,:), k=1,2,\ldots,\frac{N}{M}; m=1,\ldots,M \quad (11)$$

Then, equation (12) can be found:

$$t_{(m)} = (e_{(m)} B_{(m)})(B_{(m)}' B_{(m)})^{-1} \quad (12)$$

where $t_{(m)}$ is the row vector with T (S times M) coefficients. Finally, the MIMO block 810 coefficients can be derived as shown in equation (13):

$$t_{km}{}^{(s)} = t_{(m)}(k+(s-1)M), m, k=1,\ldots,M; s=1,2,\ldots S \quad (13)$$

Figure 12:
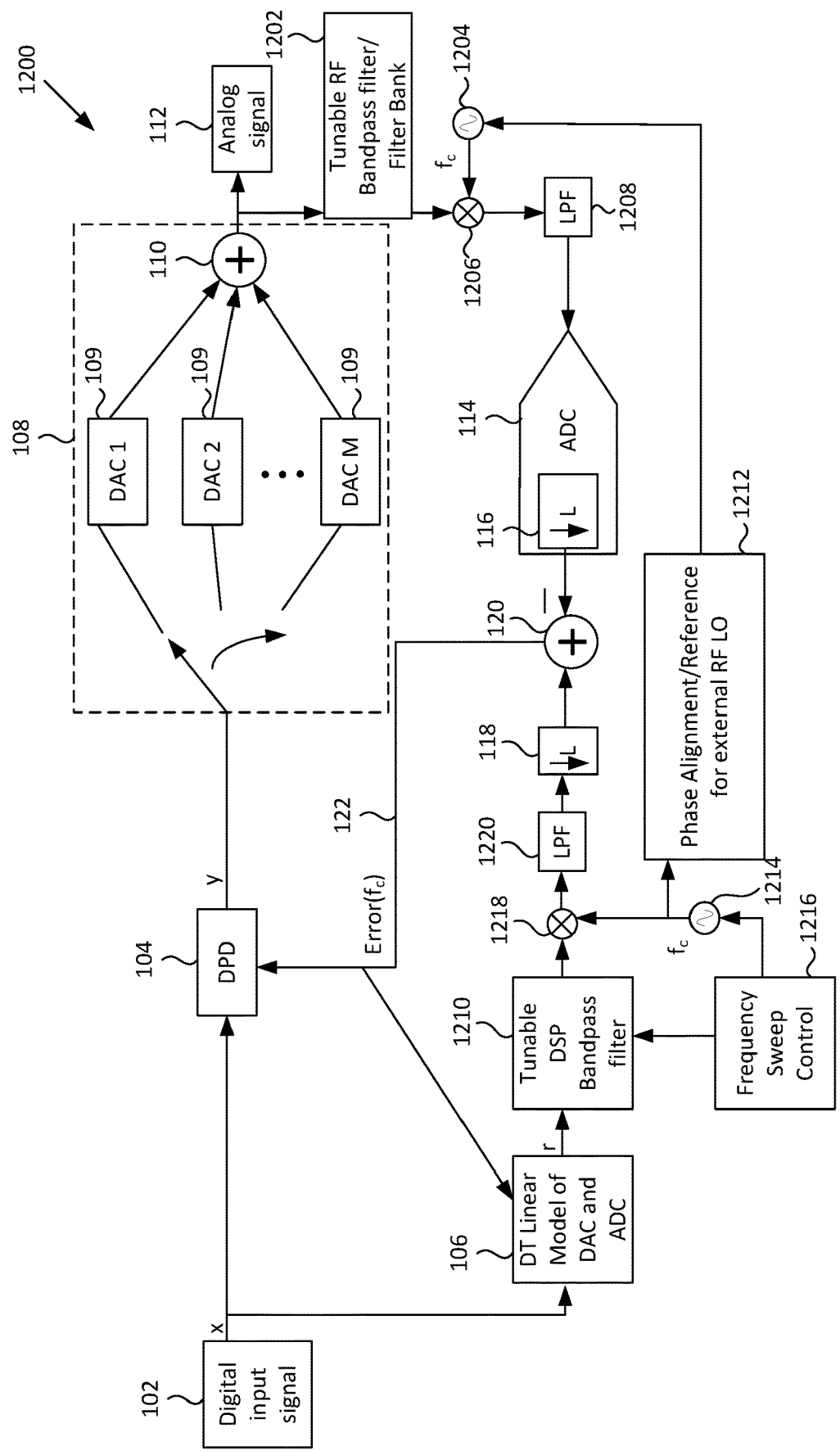
FIG. 12 is a block diagram of another time-interleaved digital-to-analog converter system according to some embodiments of the disclosure.

FIG. 12 illustrates an alternative TI DAC system 1200 according to some embodiments of the disclosure. Like components with the TI DAC system 100 are given the same reference numbers and will not be discussed in further detail with respect to FIG. 12. In the TI DAC system 1200 of FIG. 12, a tunable radio frequency (RF) bandpass filter 1202, a local oscillator 1204, a mixer 1206, and a RF low-pass filter (LPF) 1208 may be used in conjunction to down-covert the signal content in the TI DAC 108 output to a narrowband range supported by the ADC 114, at a lower bandwidth and sample rate related to TI DAC 108. Although a tunable RF bandpass filter 1202 is shown, a bank of filters may be used in some embodiments instead. A frequency range covered by each narrowband capture of a given segment of error waveform data 122 can be given as: $[f_c : f_c + BW_{ADC}]$, where $f_c$, is the LO frequency and $BW_{ADC}$ is the effective bandwidth captured by the ADC 114.

RF down-conversion topology is then mirrored using a DSP to develop a model of the expected ideal output signal content within the given frequency span covered by: $[f_c : f_c + BW_{ADC}]$, after factoring in the DT linear model 106. That is, the output of the DT linear model 106 is sent to a tunable DSP bandpass filter 1210, the output of which is mixed with a signal from a local oscillator 1214 through a mixer 1218. The tunable DSP bandpass filter 1210 and the local oscillator 1214 are set by a frequency sweep control 1216. The signal from the local oscillator 1214 is also sent to a phase aligner 1212 to be used as a reference, so that the local oscillator 1214 and the local oscillator 1204 phases can have a known phase relationship to ensure coherent phase in the segments captured by the ADC 114 relative to the DT linear model 106 as modified by the tunable DSP bandpass filter 1210, mixer 1218, local oscillator 1214, and a low pass filter 1220, to allow the waveforms to be subtracted to generate the error signal 122.

A segment of the error signal 122 can be captured for each narrowband frequency span. The segment size used in capturing the error signal 122 determines the effective frequency resolution that can be achieved within the frequency span covered by each acquired narrowband segment $[f_c : f_c + BW_{ADC}]$. The resulting segments can go through a discrete Fourier transform (DFT) in the DPD unit 104, as discussed below, to generate a complex vector of estimated error, magnitude and phase components, versus frequency for frequencies covered by each narrowband frequency span.

The local oscillator 1204 frequency is swept to cover the full frequency range of interest for calibration of the TI DAC 108. The resulting estimated frequency-domain error vectors, following DFT of the error signal 122 that is captured for each narrowband frequency span, are then combined to generate the aggregate complex frequency-domain error vector, e, as shown in equations (14)-(17):

$$f_c = n \cdot BW_{ADC}, n \in [0, \ldots N-1] \quad (14)$$

$$E(f) = \sum_{n=0}^{N-1} E_n(f - n \cdot BW_{ADC}) \quad (15)$$

$$f = \begin{bmatrix} f_1 \\ f_2 \\ \ldots \\ f_K \end{bmatrix} \quad (16)$$

[0081]

$$e = E(f) \quad (17)$$

Where $E_n(f)$ is the DFT output samples for each narrowband error waveform segment (within bandwidth captured by narrowband ADC 114), $f \in [0: BW_{ADC})$, $E(f)$ is the aggregate frequency-domain error waveform, f is the vector of frequency values used to solve for adaptive DPD coefficients, and e is the aggregate frequency-domain error waveform vector used to solve for adaptive DPD coefficients.

The next iteration of DPD coefficients determined by the DPD unit 104 can then be solved in the frequency domain. Successive DFTs of the input waveforms to the parallel multiplication with adaptation blocks 208 in the DPD unit 104 can be performed to generate a vector of input waveform impairments versus frequency for each impairment type modeled in the DPD unit 104 to match the frequencies covered by the frequency-domain vector, e. The input waveforms to the parallel multiplication with adaptation blocks 208 can be captured in segments that are time aligned with the segments captured by the narrowband ADC 114. The DFT of each segment can be performed to extract a complex vector, including magnitude and phase components, of frequency domain samples that align with the frequency span covered for the corresponding error signal 122 captured in that segment by the narrowband ADC 114 within the frequency sweep range sequence. Then, an aggregate vector to estimate the frequency-domain error waveform, e, is built by combining the frequency domain vectors captured for each segment across all successive segments, in the frequency sweep sequence, to cover the full frequency range used in calibration.

Equation (18) can then be used to compute the estimated residual error, in the frequency domain:

$$\hat{e} = -Wc \quad (18)$$

Where $\hat{e}$ is the vector for an estimated aggregate frequency-domain residual error waveform after impact of current DPD correction coefficients is factored in, which is a sum of errors due to each impairment type at output of narrowband ADC 114 aggregated across frequency range covered by LO 1204 frequency sweep. W is the input waveform impairment matrix (in frequency domain) prior to scaling by parallel multiplication with adaptation blocks 208 in the DPD unit 104 with base impairment values in the row dimension (inputs to the multiplication with adaptation blocks 208), and successive values over frequency in the column dimension. Variable c is the residual coefficient vector to scale magnitude of impairments values in the multiplication with adaptation blocks 208 to counteract impairments of DAC 108, i.e. minimize residual error, which can be added to the current DPD coefficient vector.

Equations (14)-(18) can be overdetermined in general and a least squared solution can be found to minimize the following expression:

$$\min_c \| -Wc - e \|,$$

where e is the vector for aggregate frequency-domain residual error waveform measured from full sweep across frequency range with successive segment captures followed by DFT.

Thus, the least squared solution is given by equation (19):

$$c = -(W^T W)^{-1} W^T e \quad (19)$$

Equation (19) can be found provided that the $W^T W$ matrix is not singular (i.e. $|W^T W| \neq 0$).

The DPD coefficient adaptation for background calibration (that occurs in parallel of generating arbitrary waveform for DAC output) can be done using equation (20):

$$d_n = d_{n-1} + \mu c \quad (20)$$

Where $d_n$, is the next vector of DPD coefficients, $d_{n-1}$ is the current vector of DPD coefficients, $\mu$ is the adaptation rate, which can potentially be dynamically adjusted, such as with a normalized LMS type of approach, and c is the coefficients solved from frequency domain optimization of residual error over a current frequency sweep.

This approach may also be applied to foreground calibration. In such embodiments, a known set of input waveforms can be used that are optimized to the needs of DAC calibration. Then, the DPD unit 104 coefficients can be solved in the frequency domain per equation (19).

Figure 13:
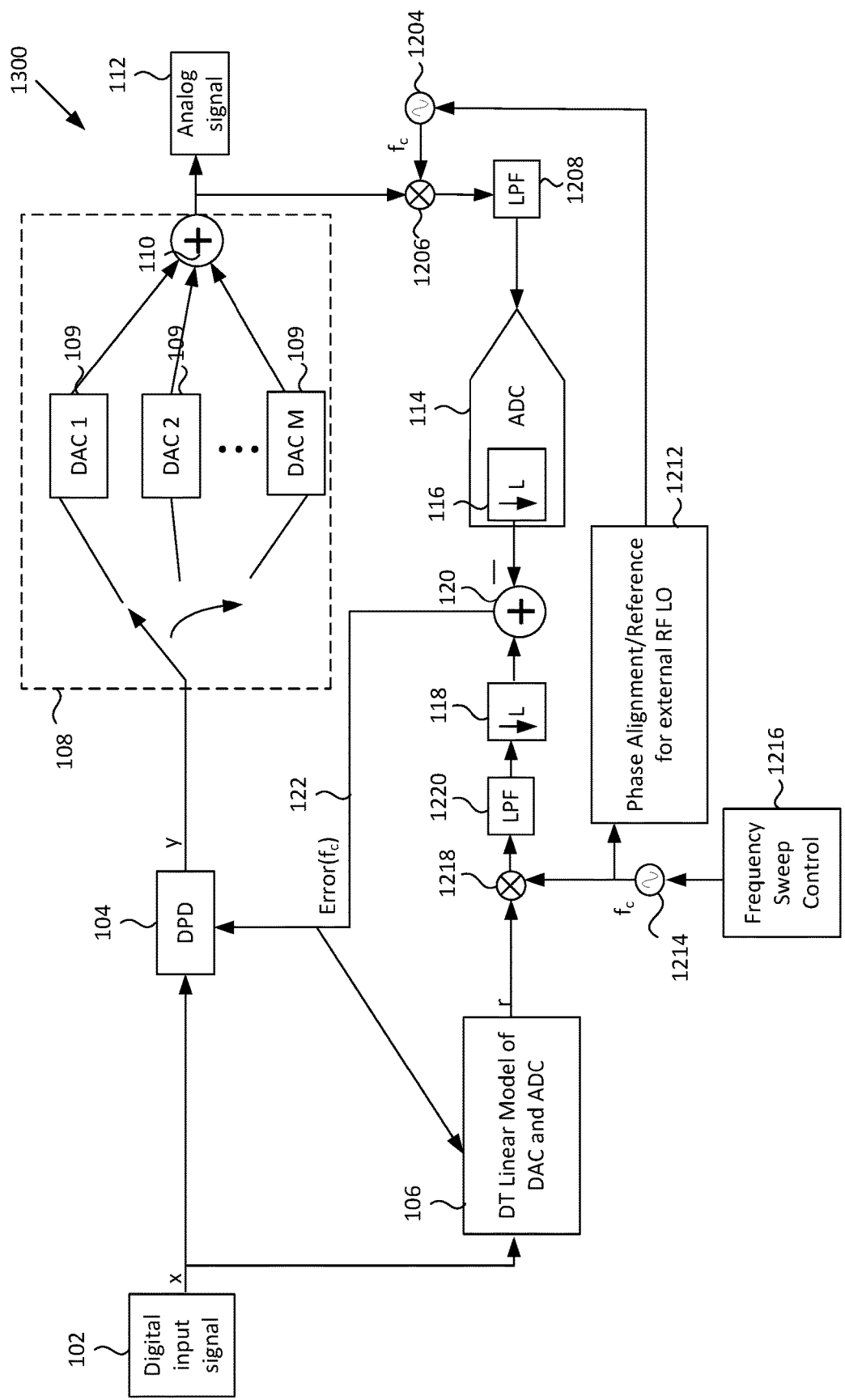
FIG. 13 is a block diagram of another time-interleaved digital-to-analog converter system according to some embodiments of the disclosure.

FIG. 13 illustrates another alternative embodiment according to embodiments of the disclosure. The embodiment of FIG. 13 is similar to the embodiments discussed above in FIGS. 1 and 12, and as such, like components are given the same reference numbers and not further discussed with respect to FIG. 13. In TI DAC system 1300, the tunable RF bandpass filter 1202 and the tunable DSP bandpass filter 1210 are removed. This may simplify and reduce the system cost, given the complexity of tunable RF bandpass filters 1202. Removing the bandpass filters 1202 and 1210 results in both mixer input images ($f+f_c$ in addition to $f-f_c$) in the resulting narrowband spectrum captured by the ADC 114.

Having both mixer input images ($f+f_c$ in addition to $f-f_c$) in the narrowband spectrum can be mitigated by additional processing of the estimated residual complex frequency-domain error frequency.

Each narrowband ADC capture segment and resulting residual error waveform would include the following signal content in equations (21) and (22):

$$f_c = n \cdot BW_{ADC}, n \in [0, \ldots, N-1] \quad (21)$$

$$G_n(f) = \begin{cases} \begin{cases} E(f), & n = 0 \\ E(f+f_c) + E(f-f_c), & n \geq 1 \end{cases} & f \in [0: BW_{ADC}) \\ 0, & f \geq BW_{ADC} \end{cases} \quad (22)$$

The desired residual error waveform can then be iteratively extracted from $G_n(f)$ in segments as shown in equation (23):

$$E_n(f) = \begin{cases} G_0(f) & n = 0 \\ G_n(f) - E_{n-1}^*(BW_{ADC} - f), & n \geq 1 \end{cases}, f \in [0: BW_{ADC}] \quad (23)$$

The segments can then be aggregated to generate the residual error waveform, as shown in equation (24):

$$E(f) = \sum_{n=0}^{N-1} E_n(f - n \cdot BW_{ADC}) \quad (24)$$

After the residual error waveform is obtained in the frequency domain, a similar process can be used to solve for the adaptive DPD coefficients as described above for the narrowband frequency sweep option that included the tunable band-pass filters.

Other variations of the narrowband ADC with down-conversion approach to DPD coefficient adaptation are possible. One such example is adapting this approach to other RF down-conversion architectures such as a complex I/Q super-heterodyne receiver topology.

Figure 14:
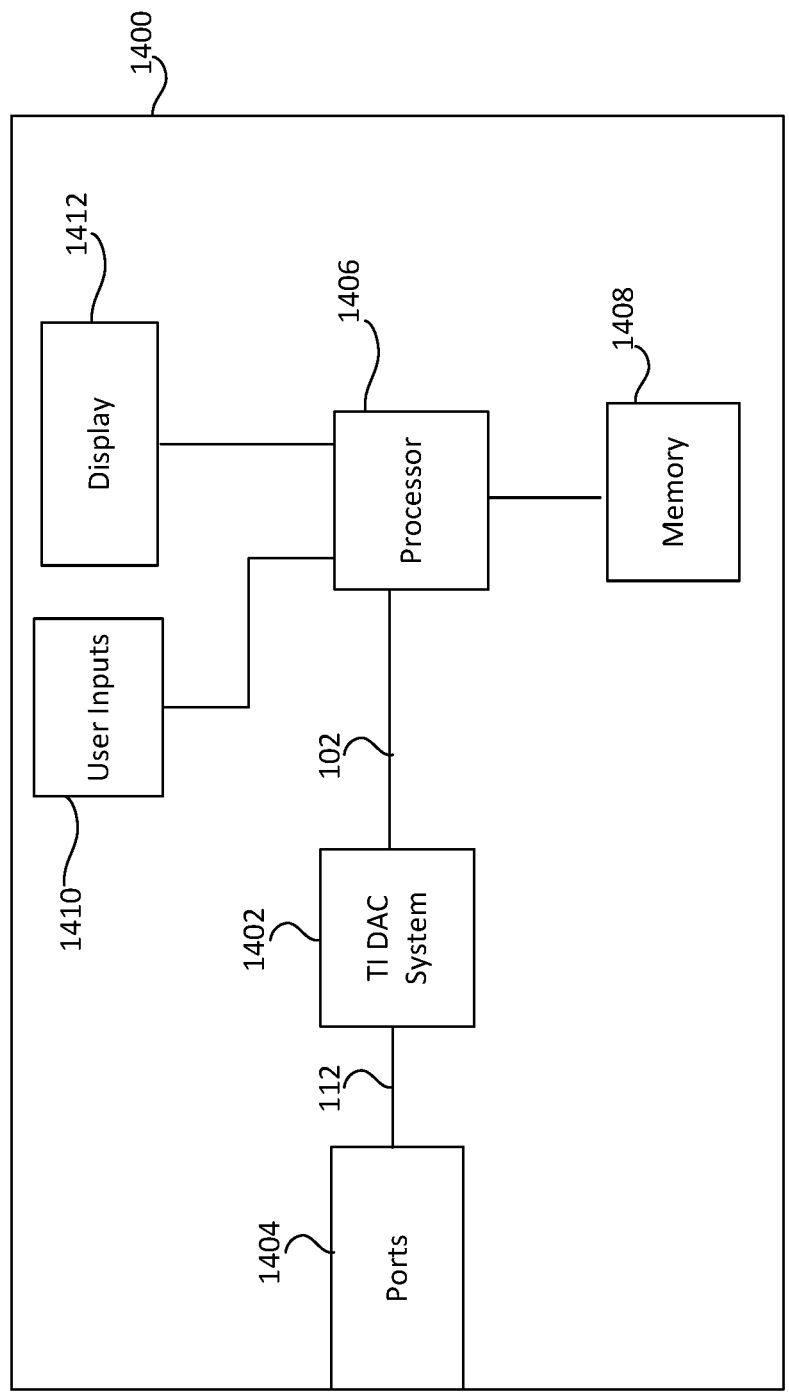
FIG. 14 is a block diagram of a test and measurement instrument according to other embodiments of the disclosure.

FIG. 14 illustrates an example test and measurement instrument 1400 with a TI DAC system 1402. The TI DAC system 1402 may be any of TI DAC systems 100, 1200, or 1300 discussed above. The test and measurement instrument 1400, may be, for example, an arbitrary waveform generator, arbitrary function generator, or any test and measurement instrument that outputs a signal source.

The test and measurement instrument 1400 includes one or more ports 1404 which may be any electrical or fiber optic signaling medium. Ports 1404 may include receivers, transmitters, and/or transceivers. The ports 1404 are coupled with the TI DAC system 1402 which is connected to one or more processors 1406. Although only one processor 1406 is shown in FIG. 14 for ease of illustration, as will be understood by one skilled in the art, multiple processors 1406 of varying types may be used in combination, rather than a single processor 1406.

The one or more processors 1406 may be configured to execute instructions from memory 1408 and may perform any methods and/or associated steps indicated by such instructions. Memory 1408 may be implemented as processor cache, random access memory (RAM), read only memory (ROM), solid state memory, hard disk drive(s), or any other memory type. Memory 1408 acts as a medium for storing data, computer program products, and other instructions. For example, the one or more processors 1406 may output a digital signal to the TI DAC system 1402 that is to be output as an analog signal, such as described above, to a device under test through ports 1404.

User inputs 1410 are coupled to the one or more processors 1406. User inputs 1410 may include a keyboard, mouse, trackball, touchscreen, and/or any other controls employable by a user to with a GUI on the display 1412. The display 1412 may be a digital screen, a cathode ray tube based display, or any other monitor to display waveforms, measurements, and other data to a user. While the components of test instrument 1400 are depicted as being integrated within test and measurement instrument 1400, it will be appreciated by a person of ordinary skill in the art that any of these components can be external to test instrument 1400 and can be coupled to test instrument 1400 in any conventional manner (e.g., wired and/or wireless communication media and/or mechanisms). For example, in some embodiments, the display 1412 may be remote from the test and measurement instrument 1400.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), Field Programmable Gate Arrays (FPGAs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a time-interleaved digital-to-analog converter system, comprising a digital pre-distorter configured to receive an input digital signal and an error signal and output a distorted digital signal based on the input digital signal and the error signal; a time-interleaved digital-to-analog converter having a first sample rate, the time-interleaved digital-to-analog converter configured to convert the distorted digital signal to an analog signal, the distorted signal correcting mismatch between time-interleaved channels of the time-interleaved digital-to-analog converter; and a calibration system comprising: an analog-to-digital converter having a second sample rate equal to or lower than the first sample rate, the analog-to-digital converter configured to receive the analog signal and covert the analog signal to a down-sampled digital signal, a discrete-time linear model configured to receive the input digital signal and output a model signal, and a combiner to subtract the down-sampled digital signal from the model signal to generate the error signal.

Example 2 is the time-interleaved digital-to-analog converter system of example 1, wherein the discrete-time linear model also receives the error signal and includes a finite impulse response filter having at least one adaptive tap and a constant tap.

Example 3 is the time-interleaved digital-to-analog converter system of either one of examples 1 and 2, wherein the calibration system is enabled during a pre-operation calibration with a known digital input signal.

Example 4 is the time-interleaved digital-to-analog converter system of example 3, further comprising a digital signal processor configured to determine whether to disable the calibration system during operation with an unknown digital input signal based on the digital input signal.

Example 5 is the time-interleaved digital-to-analog converter system of any one of examples 1-4, wherein the digital pre-distorter includes a plurality of delay lines with different order products, each delay line receiving the digital input signal.

Example 6 is the time-interleaved digital-to-analog converter system of example 5, wherein the digital pre-distorter further includes: a plurality of first demultiplexers, each first demultiplexer for each output of the delay lines with different order products, each first demultiplexer receiving the output of each of the delay lines and outputting a parallel stream of data having a number of signals equal to a number of channels of the time-interleaved digital-to-analog converter; a plurality of second demultiplexers, each second demultiplexer to receive the error signal and output a parallel stream of error data having a number of signals equal to a number of channels of the time-interleaved digital-to-analog converter; a plurality of coefficient adapters, each coefficient adapter to correlate the respective parallel stream of data and the parallel stream of error data and output a number of variable coefficients equal to the number of channels of the time-interleaved digital-to-analog converter; a plurality of first combiners, each first combiner to combine the respective variable coefficients with the parallel stream of data into a parallel stream of combined data; a plurality of multiplexers, each multiplexer configured to combine the respective parallel stream of combined data into a signal; and a second combiner configured to combine each of the signals from the plurality of multiplexers into the distorted digital signal.

Example 7 is the time-interleaved digital-to-analog converter system of example 6, wherein the first combiner is a point-wise multiplier to multiply the variable coefficients with the parallel stream of data;

Example 8 is the time-interleaved digital-to-analog converter system of either one of examples 6 and 7, wherein the first combiner is a multiple input, multiple output unit having a number of finite impulse response filters.

Example 9 is the time-interleaved digital-to-analog converter system of example 8, wherein the coefficient adapter is a multiple input, multiple output coefficient adapter.

Example 10 the time-interleaved digital-to-analog converter system of any one of examples 1-9, wherein the calibration system operates in real-time.

Example 11 is a test and measurement instrument, comprising the time-interleaved digital-to-analog converter system of any one of examples 1-10; and a port configured to receive the analog signal and output the analog signal to an electrically or fiber optically coupled device under test.

Example 12 is a method for calibrating a time-interleaved digital-to-analog converter, comprising: generating a distorted digital signal by distorting an input digital signal based on an error signal; converting the distorted digital signal to an analog signal through a time-interleaved digital-to-analog converter; converting the analog signal to a down-sampled digital signal; generating a model signal based on the input digital signal; and generating the error signal by subtracting the down-sampled digital signal from the model signal.

Example 13 is the method of example 12, wherein generating the model signal includes processing the digital input signal and the error signal through a finite impulse response filter having at least one adaptive tap and a constant tap.

Example 14 is the method of either one of examples 12 or 13, further comprising enabling the method during a pre-operation calibration with a known digital input signal.

Example 15 is the method of any one of examples 12-14, further comprising enabling the method during operation with an unknown digital input signal based on the digital input signal.

Example 16 is the method of any one of examples 12-15, further comprising delaying the digital input signal through a plurality of delay lines with different order products.

Example 17 is the method of example 16, further comprising: receiving an output of each of the delay lines at a respective first demultiplexer and outputting from each respective first demultiplexer a parallel stream of data having a number of signals equal to a number of channels of the time-interleaved digital-to-analog converter; receiving the error signal and outputting at each of a plurality of second demultiplexers a parallel stream of error data having a number of signals equal to a number of channels of the time-interleaved digital-to-analog converter; correlating the respective parallel stream of data and the respective parallel stream of error data and outputting at each coefficient adapter of a plurality of coefficient adapters a number of variable coefficients equal to the number of channels of the time-interleaved digital-to-analog converter; combining each of the variable coefficients with the respective parallel stream of data into a parallel stream of respective combined data; multiplexing at each multiplexer of a plurality of multiplexers the respective combined data into a respective signal; and combining each of the respective signals into the distorted digital signal.

Example 18 is the method of any one of examples 12-17, further comprising: mixing the analog signal with a signal from a local oscillator to generate a mixed signal; filtering the mixed signal through a low-pass filter prior to converting the analog signal to a down-sampled digital signal.

Example 19 is the method of any one of examples 12-18, further comprising: mixing the model signal with a signal from a local oscillator to generate a mixed signal; filtering the mixed signal through a low-pass filter; down-sampling the filtered mixed signal prior to generating the error signal.

Example 20 is the method of example 19, further comprising filtering the model signal through a tunable bandpass filter prior to mixing the model signal with the signal from the first local oscillator.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A time-interleaved digital-to-analog converter system, comprising:
    a digital pre-distorter configured to receive an input digital signal and an error signal and output a distorted digital signal based on the input digital signal and the error signal;
    a time-interleaved digital-to-analog converter having a first sample rate, the time-interleaved digital-to-analog converter configured to convert the distorted digital signal to an analog signal, the distorted signal correcting mismatch between time-interleaved channels of the time-interleaved digital-to-analog converter; and
    a calibration system comprising:
        an analog-to-digital converter having a second sample rate equal to or lower than the first sample rate, the analog-to-digital converter configured to receive the analog signal and covert the analog signal to a down-sampled digital signal,
        a discrete-time linear model configured to receive the input digital signal and output a model signal, and
        a combiner to subtract the down-sampled digital signal from the model signal to generate the error signal.

2. The time-interleaved digital-to-analog converter system of claim 1, wherein the discrete-time linear model also receives the error signal and includes a finite impulse response filter having at least one adaptive tap and a constant tap.

3. The time-interleaved digital-to-analog converter system of claim 1, wherein the calibration system is enabled during a pre-operation calibration with a known digital input signal.

4. The time-interleaved digital-to-analog converter system of claim 3, further comprising a digital signal processor configured to determine whether to disable the calibration system during operation with an unknown digital input signal based on the digital input signal.

5. The time-interleaved digital-to-analog converter system of claim 1, wherein the digital pre-distorter includes a plurality of delay lines with different order products, each delay line receiving the digital input signal.

6. The time-interleaved digital-to-analog converter system of claim 5, wherein the digital pre-distorter further includes:
    a plurality of first demultiplexers, each first demultiplexer for each output of the delay lines with different order products, each first demultiplexer receiving the output of each of the delay lines and outputting a parallel stream of data having a number of signals equal to a number of channels of the time-interleaved digital-to-analog converter;
    a plurality of second demultiplexers, each second demultiplexer to receive the error signal and output a parallel stream of error data having a number of signals equal to a number of channels of the time-interleaved digital-to-analog converter;
    a plurality of coefficient adapters, each coefficient adapter to correlate the respective parallel stream of data and the parallel stream of error data and output a number of variable coefficients equal to the number of channels of the time-interleaved digital-to-analog converter;
    a plurality of first combiners, each first combiner to combine the respective variable coefficients with the parallel stream of data into a parallel stream of combined data;
    a plurality of multiplexers, each multiplexer configured to combine the respective parallel stream of combined data into a signal; and
    a second combiner configured to combine each of the signals from the plurality of multiplexers into the distorted digital signal.

7. The time-interleaved digital-to-analog converter system of claim 6, wherein the first combiner is a point-wise multiplier to multiply the variable coefficients with the parallel stream of data.

8. The time-interleaved digital-to-analog converter system of claim 6, wherein the first combiner is a multiple input, multiple output unit having a number of finite impulse response filters.

9. The time-interleaved digital-to-analog converter system of claim 8, wherein the coefficient adapter is a multiple input, multiple output coefficient adapter.

10. The time-interleaved digital-to-analog converter system of claim 1, wherein the calibration system operates in real-time.

11. A test and measurement instrument, comprising:
    the time-interleaved digital-to-analog converter system of claim 1; and
    a port configured to receive the analog signal and output the analog signal to an electrically or fiber optically coupled device under test.

12. A method for calibrating a time-interleaved digital-to-analog converter, comprising:
    generating a distorted digital signal by distorting an input digital signal based on an error signal;
    converting the distorted digital signal to an analog signal through a time-interleaved digital-to-analog converter;
    converting the analog signal to a down-sampled digital signal;
    generating a model signal based on the input digital signal; and
    generating the error signal by subtracting the down-sampled digital signal from the model signal.

13. The method of claim 12, wherein generating the model signal includes processing the digital input signal and the error signal through a finite impulse response filter having at least one adaptive tap and a constant tap.

14. The method of claim 12, further comprising enabling the method during a pre-operation calibration with a known digital input signal.

15. The method of claim 12, further comprising enabling the method during operation with an unknown digital input signal based on the digital input signal.

16. The method of claim 12, further comprising delaying the digital input signal through a plurality of delay lines with different order products.

17. The method of claim 16, further comprising:
receiving an output of each of the delay lines at a respective first demultiplexer and outputting from each respective first demultiplexer a parallel stream of data having a number of signals equal to a number of channels of the time-interleaved digital-to-analog converter;
receiving the error signal and outputting at each of a plurality of second demultiplexers a parallel stream of error data having a number of signals equal to a number of channels of the time-interleaved digital-to-analog converter;
correlating the respective parallel stream of data and the respective parallel stream of error data and outputting at each coefficient adapter of a plurality of coefficient adapters a number of variable coefficients equal to the number of channels of the time-interleaved digital-to-analog converter;
combining each of the variable coefficients with the respective parallel stream of data into a parallel stream of respective combined data;
multiplexing at each multiplexer of a plurality of multiplexers the respective combined data into a respective signal; and
combining each of the respective signals into the distorted digital signal.

18. The method of claim 12, further comprising:
mixing the analog signal with a signal from a local oscillator to generate a mixed signal;
filtering the mixed signal through a low-pass filter prior to converting the analog signal to a down-sampled digital signal.

19. The method of claim 12, further comprising:
mixing the model signal with a signal from a local oscillator to generate a mixed signal;
filtering the mixed signal through a low-pass filter;
down-sampling the filtered mixed signal prior to generating the error signal.

20. The method of claim 19, further comprising:
filtering the model signal through a tunable bandpass filter prior to mixing the model signal with the signal from the first local oscillator.

* * * * *